(12) United States Patent
Sekido et al.

(10) Patent No.: US 8,467,895 B2
(45) Date of Patent: Jun. 18, 2013

(54) PROCESSING SYSTEM AND METHOD FOR OPERATING THE SAME

(75) Inventors: Koichi Sekido, Nirasaki (JP); Hirofumi Yamaguchi, Nirasaki (JP); Bae Junghwan, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1355 days.

(21) Appl. No.: 12/083,015

(22) PCT Filed: Oct. 6, 2006

(86) PCT No.: PCT/JP2006/320109
§ 371 (c)(1),
(2), (4) Date: Apr. 3, 2008

(87) PCT Pub. No.: WO2007/040278
PCT Pub. Date: Apr. 12, 2007

(65) Prior Publication Data
US 2009/0226294 A1  Sep. 10, 2009

(30) Foreign Application Priority Data

Oct. 6, 2005  (JP) .................................. 2005-293726
Mar. 3, 2006  (JP) .................................. 2006-057592

(51) Int. Cl.
*B05C 11/00*   (2006.01)
*C23F 1/00*    (2006.01)
*G06F 19/00*   (2006.01)

(52) U.S. Cl.
USPC ............ 700/121; 700/99; 700/100; 700/101; 700/108; 118/699; 118/704; 156/345.24; 156/345.25; 156/345.31

(58) Field of Classification Search
USPC .................... 700/121, 108, 99–101; 118/699, 118/704; 156/345.25, 345.24, 345.31; 204/298.23; 414/806

See application file for complete search history.

(56) References Cited

U.S. PATENT DOCUMENTS 5,700,127 A * 12/1997 Harada et al. ............ 414/416.08
5,801,945 A *  9/1998 Comer ......................... 700/100

(Continued)

FOREIGN PATENT DOCUMENTS

JP       11-54587    2/1999
JP       11-67869    3/1999

(Continued)

OTHER PUBLICATIONS

PCT Notification of Transmittal of Translation of the International Preliminary Examination Report (Form PCT/IB/338) dated Jan. 2004.

(Continued)

*Primary Examiner* — Mohammad Ali
*Assistant Examiner* — Jennifer L Norton
(74) *Attorney, Agent, or Firm* — Smith, Gambrell & Russell, LLP

(57) ABSTRACT

An operating method is disclosed for a processing system that comprises multiple process modules each adapted to perform substantially the same process upon a substrate. During process module conditioning as a preparatory step for executing a required process recipe, each time one process module completes conditioning, successive transfer of unprocessed substrates from a cassette to the process module is started on an associated substrate transfer route, and successive processes that use the process module are started for the unprocessed substrates. The processing system can be operated efficiently, even if the nonuniformity of the conditioning time required exists between process modules of the same specifications.

10 Claims, 11 Drawing Sheets

U.S. PATENT DOCUMENTS

| | | |
|---|---|---|
| 6,678,572 B1 * | 1/2004 | Oh .................................. 700/121 |
| 6,711,454 B2 * | 3/2004 | Joma et al. ..................... 700/121 |
| 7,072,730 B2 * | 7/2006 | Kobayashi et al. ............ 700/100 |
| 7,292,903 B2 * | 11/2007 | Tseng et al. ...................... 700/99 |
| 7,337,032 B1 * | 2/2008 | Nettles et al. .................. 700/100 |
| 2001/0011198 A1 * | 8/2001 | Jevtic ............................. 700/100 |
| 2001/0039462 A1 * | 11/2001 | Mendez et al. ................... 700/45 |
| 2002/0096114 A1 * | 7/2002 | Carducci et al. ............... 118/715 |
| 2004/0016637 A1 * | 1/2004 | Yang et al. ..................... 204/242 |
| 2005/0061240 A1 | 3/2005 | Hashinoki et al. |
| 2006/0021575 A1 * | 2/2006 | Ishizawa et al. .............. 118/719 |
| 2006/0149404 A1 * | 7/2006 | Denton et al. .................... 700/99 |
| 2007/0203606 A1 * | 8/2007 | Quarg ............................ 700/121 |
| 2009/0279989 A1 * | 11/2009 | Wong et al. .................... 414/217 |

FOREIGN PATENT DOCUMENTS

| | | |
|---|---|---|
| JP | 2000-127069 | 5/2000 |
| JP | 2001-210581 | 8/2001 |
| JP | 2005-101076 | 4/2005 |

OTHER PUBLICATIONS

PCT International Preliminary Report on Patentability (Form PCT/IB/373) dated Jan. 2004.

PCT Written Opinion of the International Searching Authority (Form/ISA/237) dated Apr. 2005.

* cited by examiner

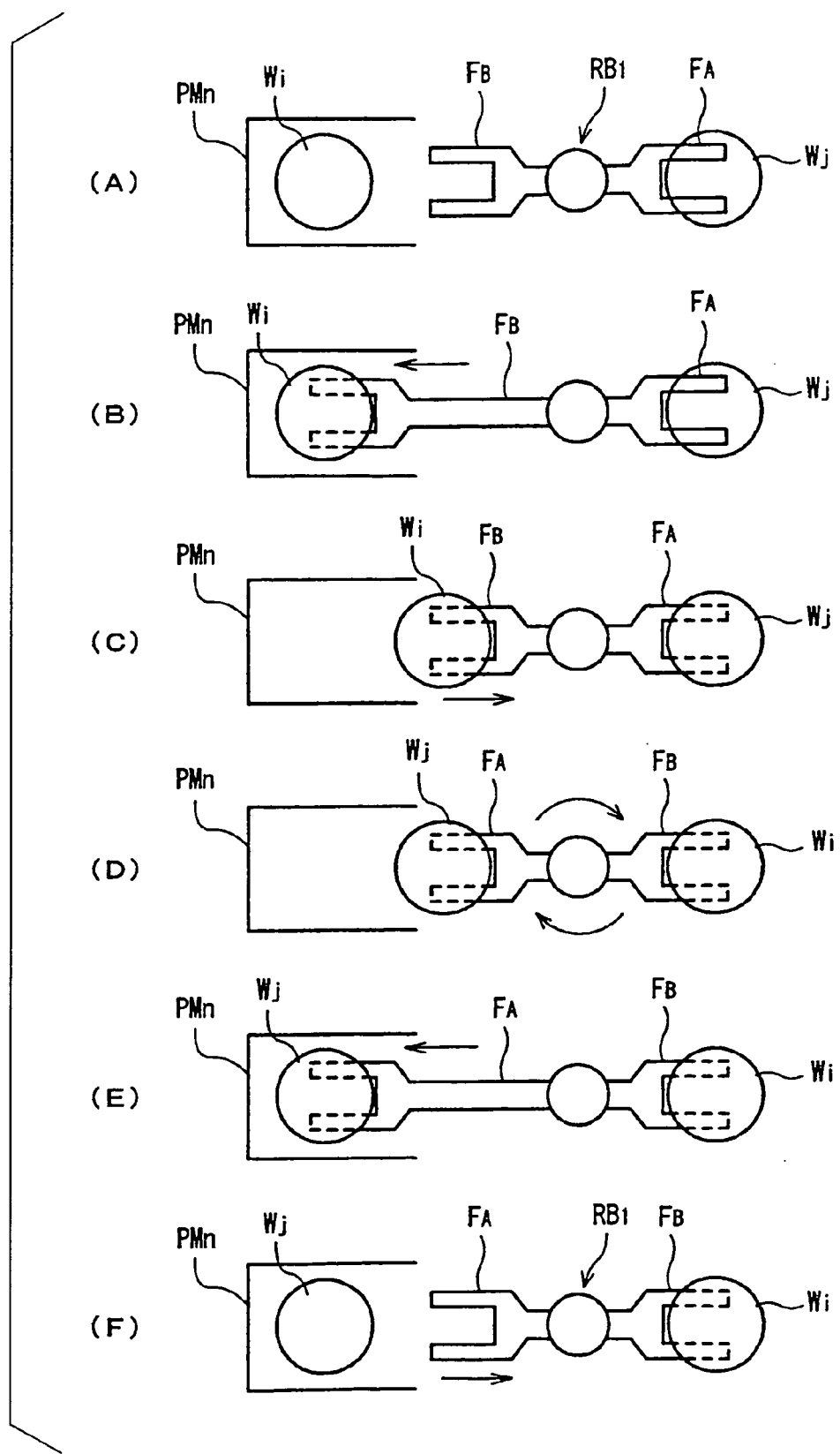
F I G. 2

PROCESSING SYSTEM AND METHOD FOR OPERATING THE SAME

TECHNICAL FIELD

The present invention generally relates to inline-type processing systems each having a plurality of process modules in concentrated form around a transfer unit, and more particularly, to a processing system that causes plural process modules or plural sets of process modules to perform substantially the same process in parallel.

BACKGROUND ART

A cluster tool, for example, is a processing system constructed with a plurality of process modules that are arranged around a main transfer chamber so that the modules can each perform the same process or a different process continuously or concurrently, and is typically employed in semiconductor-manufacturing equipment (refer to JP2000-127069A, for example).

In such a cluster-tool type of processing system, each process module has a process module controller configured to control the operation and states of the internal sections of the module and to control the execution of the process. In addition, a transfer mechanism within the main transfer chamber has a transfer module controller configured to control the transfer procedures and the operation of transfer arms. Predetermined single-substrate processing by each process module and substrate transfer by the transfer mechanism are repeated at fixed time cycle and in a fixed transfer pattern, while recipe information, control signals, and the like are communicated between the module controllers and a main controller that undertakes integrated control of the entire system. In particular, when plural process modules or plural sets of process modules perform processes of the same recipe in parallel, productivity of a single-process or a composite-process can be doubled.

Such a processing system as discussed above usually operates continuously for a long period of time to achieve high productivity, and is also flexible enough to perform various kinds of processes depending on process recipes. Between production lots, "conditioning" that stops all intra-system substrate transfer operations and adjust intra-module parameters to predetermined values is performed in each process module for execution of new process recipes, using a considerable long time. Typical examples of such parameters include, for example, the internal temperatures and inner-wall states of the process chamber or vacuum chamber of the process module. The temperature of a susceptor for holding and heating the substrate is particularly important as the internal temperature of the chamber.

However, even in a case where a plurality of process modules or plural sets of process modules perform processes of the same recipe, since the process modules have individual differences, the time necessary for the parameters to reach predetermined values may vary between the process modules. For example, even if the process temperature defined by the recipe is 600° C., there may be a case where the set susceptor temperature is 590° C. in one process module and 610° C. in another process module. In addition, even if the set susceptor temperature is the same between process modules, variation in the sensitivity of temperature sensors provided in respective process modules due to individual difference may cause differences in the timing at which the arrival at the predetermined temperature is judged. In such cases, the time when conditioning is completed will vary between the process modules, and the difference between the maximum value and minimum value of the conditioning-completion time will increase as the number of process modules is increased.

Conventional cluster tools are constructed so that if there is even one process module that has not completed conditioning for a new process recipe, all other process modules stand by and when conditioning of the last process module is completed, all process modules will start to operate at the same time. Under such stand-by state as mentioned above, however, the system itself is in substantially no operation. Conventional systems have therefore admitted of improvement in productivity.

DISCLOSURE OF THE INVENTION

The present invention has been made in view of the above problems, and the object of the invention is to provide a processing system which is improved in its productivity by utilizing total system resources as effectively as possible, even if the conditioning time for a desired process varies between process modules In order to achieve the above objective, in a first aspect of the present invention, there is provided a processing system, which includes: a plurality of process modules each configured to perform substantially the same process to a substrate; a transfer system including a first transfer module and configured to transfer each of plural substrates from a cassette containing the plural substrates to any one of the process modules, wherein the plurality of process modules are connected to a peripheral region of the first transfer module; and a controller that controls operation of the transfer system and the process modules, wherein the controller is configured to control the operation of the transfer system and the process modules such that, when the plurality of process modules perform conditioning for placing each of the process modules in condition for execution of the process, each time the conditioning of one of the process modules is completed, the transfer system starts successive transfer of the substrates on a transfer route extending from the cassette to said one process module which has completed the conditioning, and such that said one process module starts successive processing of the substrates.

When the successive transfer of the substrates is started, a starting position of the transfer of the first single substrate or first several substrates does not need to be inside the cassette. The starting position of the transfer can be anywhere in the transfer route from the cassette to the process module. This means that until the transfer has been started, the substrates can stand by at any position in the transfer route.

The present invention also provides a processing system, which includes: a plurality of process modules, including plural types of process modules, wherein the same number of process modules belong to each type such that plural sets of process modules, each set including process modules of respective types to perform a composite process composed of a series of processes, can be made up; a transfer system including a first transfer module and configured to transfer each of plural substrates from a cassette containing the plural substrates to any one of the process modules, wherein the plurality of process modules are connected to a peripheral region of the first transfer module; and a controller that controls operation of the transfer system and the process modules, wherein the controller is configured such that: when the plurality of process modules perform conditioning for placing each of the process modules in condition for execution of the process assigned to the process module, each time it becomes possible to make up a combination of process modules capable of performing the composite process from process modules having completed the conditioning, the controller establishes the combination as the set of process modules; and the controller controls the operation of the transfer system and the process modules such that the transfer system starts successive transfer of the substrates on a transfer route extending from the cassette to the process modules of the set and the process modules of the set start successive processing of the substrates.

According to a second aspect of the present invention, there is provided a method of operating a processing system, the processing system including a plurality of process modules each configured to perform substantially the same process to a substrate, and a transfer system configured to transfer each of plural substrates from a cassette containing the plural substrates to any one of the process modules, the method is characterized in that, when the plurality of process modules perform conditioning for placing each of the process modules in condition for execution of the process, each time the conditioning of one of the process modules is completed, the transfer system starts successive transfer of the substrates on a transfer route extending from the cassette to said one process module which has completed the conditioning, and such that said one process module starts successive processing of the substrates.

Further, the present invention also provides a method of operating a processing system, the processing system including a plurality of process modules, including plural types of process modules, wherein the same number of process modules belong to each type such that plural sets of process modules, each set including process modules of respective types to perform a composite process composed of a series of processes, can be made up, and a transfer system configured to transfer plural substrates from a cassette containing the plural substrates to the process modules, the method characterized in that, when the plurality of process modules perform conditioning for placing each of the process modules in condition for execution of the process assigned to the process module, each time it becomes possible to make up a combination of process modules capable of performing the composite process from process modules having completed the conditioning, the combination is established as the set of process modules, the transfer system starts successive transfer of the substrates on a transfer route extending from the cassette to the process modules of the set and the process modules of the set start successive processing of the substrates.

BRIEF DESCRIPTION OF DRAWINGS

FIG. 2 is a schematic diagram for explaining pick-and-place operation of a vacuum transfer robot shown in FIG. 1;

BEST MODE FOR CARRYING OUT THE INVENTION

Hereunder, preferred embodiments of the present invention will be described with reference to the accompanying drawings.

Figure 1:
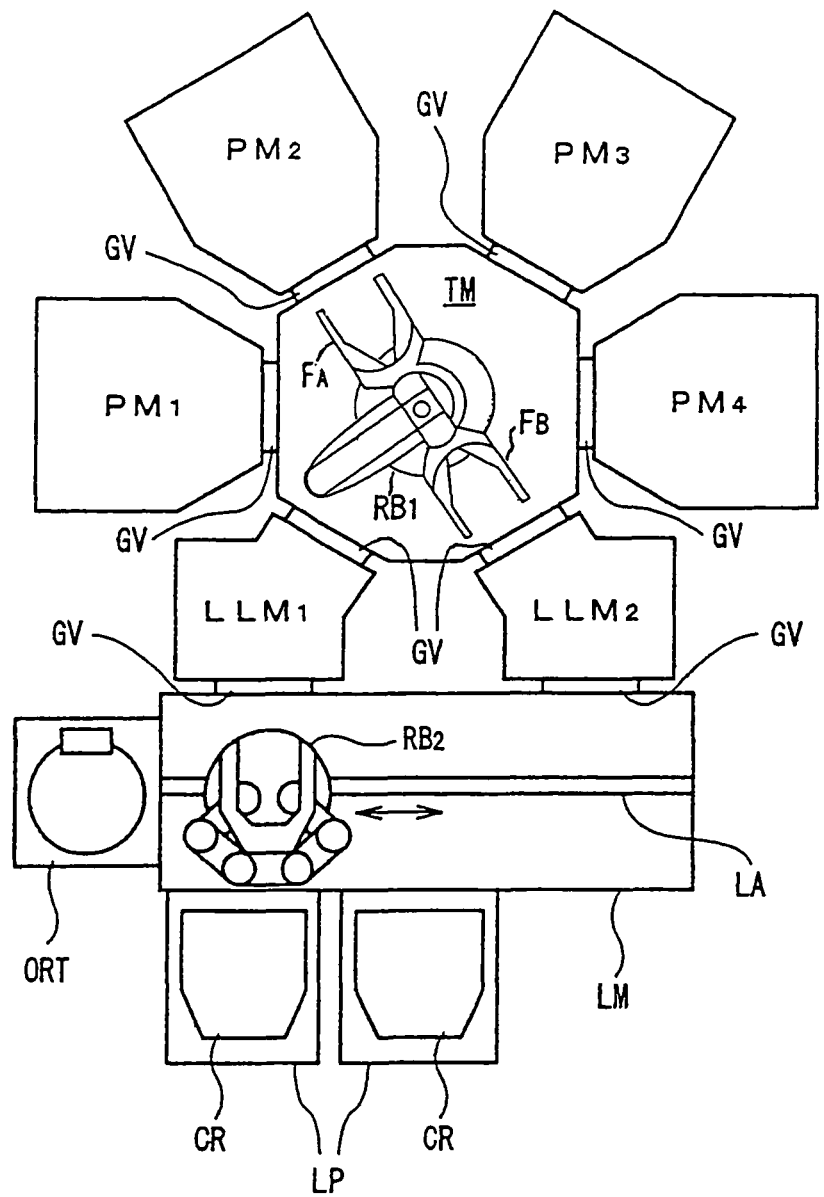
FIG. 1 is a schematic plan view showing a configuration of a processing system according to one embodiment of the present invention.

A cluster tool type of processing system in one embodiment of the present invention is shown in FIG. 1. This processing system is a multi-chamber system in which a plurality of (e.g., four) process modules $PM_1$, $PM_2$, $PM_3$, $PM_4$, and two loadlock modules, $LLM_1$, $LLM_2$, are annularly arranged around a transfer module TM that constitutes a central transfer chamber. Each of the modules has a vacuum chamber or processing chamber capable of forming therein a reduced-pressure space at a desired degree of vacuum independently. The central transfer module TM is coupled to the surrounding modules $PM_1$, $PM_2$, $PM_3$, $PM_4$, $LLM_1$, $LLM_2$ via respective gate valves GV which can be opened and closed on demand.

A vacuum transfer robot $RB_1$ with one pair of pivotable and expandable transfer arms $F_A$, $F_B$ is provided inside the transfer module TM. The transfer robot $RB_1$ operates under the control of a vacuum transfer module controller $MC_T$ (see FIG. 3), and each transfer arm $F_A$, $F_B$ is adapted to hold one object to be processed, for example, a semiconductor wafer (hereinafter, referred to simply as "wafer"), by use of an fork-shaped end effector of the arm. The transfer robot can selectively use either the transfer arm $F_A$ or $F_B$ to load/unload wafers into/from the surrounding modules $PM_1$, $PM_2$, $PM_3$, $PM_4$, $LLM_1$, $LLM_2$ through the open gate valves GV. The transfer arms $F_A$, $F_B$ are mounted to a robot main body in opposite directions, and are constructed such that they are integrally turnable and telescopically movable between a home position and a forward traveling position within the module.

The process modules $PM_1$, $PM_2$, $PM_3$, $PM_4$ have a wafer-holding pedestal or susceptor in the respective chambers, and are adapted to perform required single-wafer processes, respectively. These processes include, for example, a film deposition process such as chemical vapor deposition (CVD) or sputtering, heat treatment, dry etching, and the like. Each process module performs the required processes by controlling internal temperature, pressure, electric field, magnetic field, process gas concentration, and the like in the chamber by use of power usages (process gas, electric power, and the like) under control of respective one of process module controllers $MC_1$, $MC_2$, $MC_3$, $MC_4$ (see FIG. 3).

A heating unit or a cooling unit can be equipped inside the loadlock module $LLM_1$, $LLM_2$ according to particular needs. The loadlock modules $LLM_1$, $LLM_2$ are coupled to a loader module LM via respective gate valves (or door valves) GV, at a side opposite to the transfer module TM. The inside of the loader module LM is continuously under an atmospheric pressure. Additionally, a load port LP and an orientor ORT are provided adjacently to the loader module LM. The loadport LP is used to load wafer cassettes CR into and unload them from external mobile carriage vehicles. The orientor ORT is used to match an orientation flat or notch of each wafer W to a required position or direction. In the illustrated embodiment, the transfer module TM and the loader module LM constitute a transfer system in the processing system.

An atmospheric transfer robot $RB_2$ provided in the loader module LM has an expandable transfer arm and can move in a horizontal direction along the a linear guide LA, and can move vertically and turn. The atmospheric transfer robot $RB_2$, operates under control of an atmospheric transfer module controller $MC_L$ (see FIG. 3), and moves between the loadport LP, the orientor ORT, and the loadlock modules $LLM_1$, $LLM_2$, to carry wafers in units of one or plural wafers. The linear guide LA can be constructed using a permanent magnet, a driving excitation coil, a scale head, and more, and performs linear driving control of the transfer robot $RB_2$ in response to commands from a host controller.

Figure 3:
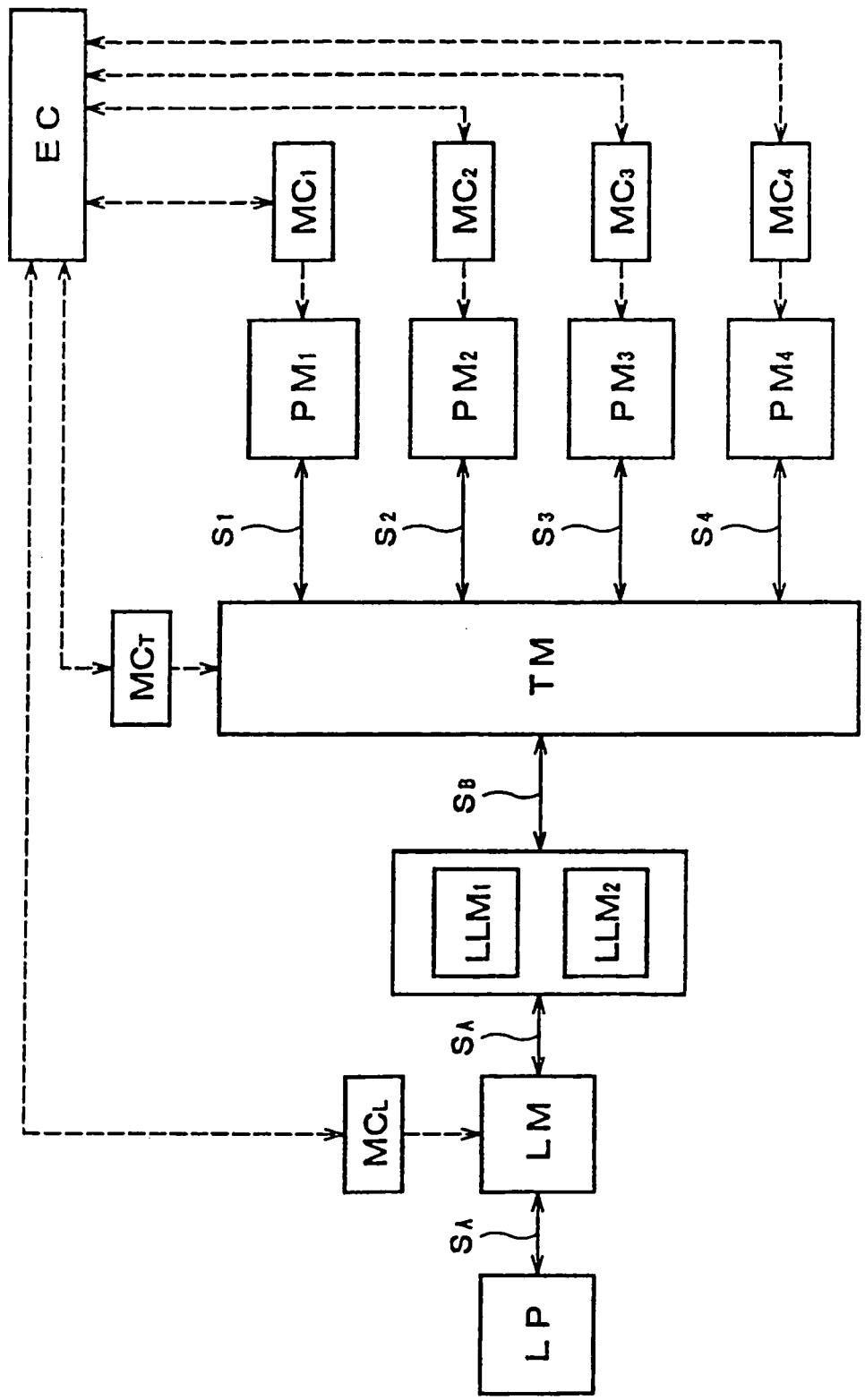
FIG. 3 is an explanatory block diagram of a control and transfer route in the processing system shown in FIG. 1.

A description will now be given of a basic wafer transfer sequence for subjecting one wafer within the loaded wafer cassette CR of the load port LP to a single process in any internal process module (e.g., $PM_1$) of this cluster tool. During wafer transfer inside the system, in order to operate various sections of this system according to a required program, required data and control signals are exchanged between an equipment controller EC that integratedly controls the entire system, the transfer (atmospheric, vacuum transfer) module controllers $MC_T$, $MC_L$, and the process module controllers $MC_1$, $MC_2$, $MC_3$, $MC_4$, as shown in FIG. 3. The configuration of the control system in this cluster tool is shown in FIG. 3 only, and omitted in other drawings.

The transfer robot $RB_2$ in the loader module LM picks one wafer $W_i$ from the wafer cassette CR on the load port LP, and after carrying the wafer $W_i$ to the orientor ORT and orienting this wafer to the required position, transfers the wafer to one of the loadlock modules LLM1, $LLM_2$, for example, to $LLM_1$. The wafer $W_i$ is loaded under the atmospheric pressure into the transfer destination loadlock module $LLM_1$. After that, the interior of the loadlock module $LLM_1$ is evacuated by an exhaust means not shown, and the wafer $W_i$ is delivered under the reduced-pressure to the vacuum transfer robot $RB_1$ in the transfer module TM.

The transfer robot $RB_1$ uses one of the transfer arms $F_A$, $F_B$ to pick the wafer $W_i$ from the loadlock module $LLM_1$, then pivots through a required angle to face the appropriate process module $PM_1$, and loads thereinto the wafer $W_i$ that has been picked from the loadlock module $LLM_1$. The process module $PM_1$ performs the required single-wafer process under predetermined conditions (gas, pressure, radio-frequency electric power, time, and the like) according to a preset recipe.

After the single-wafer process has been completed, the transfer robot $RB_1$ unloads the wafer $W_i$ from the process module $PM_1$ and returns the wafer to one of the loadlock modules $LLM_1$, $LLM_2$ (e.g., $LLM_2$). When the processed wafer $W_i$ is loaded into the loadlock module $LLM_2$, the interior of the loadlock module $LLM_2$ is switched from the reduced-pressure state to the atmospheric-pressure state. After that, the transfer robot $RB_2$ in the loader module LM picks the wafer $W_i$ from the loadlock module $LLM_2$ in the atmospheric-pressure state, and returns the wafer to the corresponding wafer cassette CR. The wafer $W_i$ may also be subjected to a heating or cooling process under a desired atmosphere, when wafer $W_i$ stays in the loadlock module $LLM_1$, $LLM_2$.

When a wafer $W_i$ is to be subjected to composite process in a set of the process modules (e.g., $PM_1$ and $PM_2$) of the cluster tool, a single wafer process, which is a first step of the composite process, is performed by the first process module $PM_1$. After the first process has been performed, the transfer robot $RB_1$ loads the wafer $W_i$ that has been unloaded from the process module $PM_1$, into the second process module (e.g., $PM_2$). The second process module $PM_2$ also performs a single wafer process, which is a second step of the composite process, under predetermined conditions according to a preset recipe.

After the second process has been completed, the transfer robot $RB_1$ unloads the wafer $W_i$ from the second process module $PM_2$ and loads the wafer into one of the loadlock modules $LLM_1$, $LLM_2$. Wafer transfer between the loadlock module $LLM_1$, $LLM_2$ and the loadport LP can be the same as in the single process described above.

In the present embodiment, the transfer robot $RB_1$ in the transfer module TM has one pair of transfer arms $F_A$, $F_B$, as described above, and is adapted to perform a pick-and-place operation including successive actions to one of the surrounding process modules $PM_1$, $PM_2$, $PM_3$, $PM_4$. The pick-and-place operation replaces a wafer having been subjected to a process in the module with a wafer to be processed in the module next.

Details of the pick-and-place operation are described below with reference to FIG. 2. As shown in (A) of FIG. 2, the transfer robot $RB_1$ faces a target process module $PM_n$ with one transfer arm (e.g., $F_A$) holding an unprocessed wafer $W_j$ to be loaded into the process module $PM_n$, and the other transfer arm (e.g., $F_B$) kept empty (i.e., without holding a wafer). After that, as shown in (B) and (C) of FIG. 2, the transfer robot $RB_1$ inserts the empty transfer arm $F_B$ into the chamber of the process module $PM_n$ and picks a processed wafer $W_i$ from the chamber (pick operation). Next, as shown in (D) of FIG. 2, the robot $RB_1$ turns the transfer arms $F_A$, $F_B$ through 180 degrees, whereby the transfer arm $F_A$ holding the unprocessed wafer $W_j$ is directed to the front side of the process module $PM_n$. Next, as shown in (E) and (F) of FIG. 2, the transfer robot $RB_1$ inserts the transfer arm $F_A$ into the chamber of the process module $PM_n$, then delivers the wafer $W_j$ to the pedestal or support pin (or the like) within the chamber, and removes the thus-emptied transfer arm $F_A$ from the chamber (place operation). The gate valve GV (see FIG. 1) that is provided at a wafer entrance/exit of the process module $PM_n$ remains open during the pick-and-place operation.

Furthermore, the transfer robot $RB_1$ can also exchange wafers between the loadlock modules $LLM_1$, $LLM_2$ by performing substantially the same pick-and-place operation as that described above. In addition, during a single pick-and-place operation cycle, the transfer robot $RB_1$ can perform the place operation immediately after completing the pick operation, or perform the place operation with a slight waiting time provided after completion of the pick operation. Alternatively, the transfer robot $RB_1$ can independently perform only the pick operation for unloading the wafer $W_i$, or only the place operation for loading the wafer $W_j$.

If two or more of the process modules $PM_1$, $PM_2$, $PM_3$, $PM_4$ in this cluster tool type of processing system are of the same model, those process modules can be made to perform processes of the same recipe in parallel fashion. For example, if all of the process modules $PM_1$, $PM_2$, $PM_3$, $PM_4$ are CVD apparatuses of the same model, film-forming processes of the same recipe can be performed in parallel fashion using the four process modules. In this case, transfer routes for transferring wafers W between the wafer cassette CR on the load port LP, and the process modules $PM_1$, $PM_2$, $PM_3$, $PM_4$, are set in the system, as shown in FIG. 3. The orientor ORT is omitted from the transfer routes shown in the figure.

More specifically, an atmospheric transfer route $S_A$, along which wafers W are subjected to two-way transfer one by one by means of the loader module LM, that is, the atmospheric transfer robot $RB_2$, is set between the loadport LP and the loadlock module ($LLM_1$, $LLM_2$). The transfer route $S_A$ is a common route through which all wafers W are passed. In addition, vacuum transfer routes $S_B$, $S_1$, $S_2$, $S_3$, and $S_4$, along which wafers W are subjected to two-way transfer one by one by means of the transfer module TM, that is, the vacuum transfer robot $RB_1$, are set between the loadlock module ($LLM_1$, $LLM_2$) and the process modules $PM_1$, $PM_2$, $PM_3$, $PM_4$. The transfer route $S_B$ is a common route through which all wafers W are passed during movement between the loadlock module ($LLM_1$, $LLM_2$) and the vacuum transfer robot $RB_1$. The transfer routes $S_1$, $S_2$, $S_3$, $S_4$ are set in parallel fashion between the vacuum transfer robot $RB_1$ and the process modules $PM_1$, $PM_2$, $PM_3$, $PM_4$, and the wafers belonging to each of four groups of wafers W are passed through the four respective routes.

An intra-system transfer sequence with all process modules $PM_1$, $PM_2$, $PM_3$, $PM_4$ in action is described below with reference to FIG. 3. Assume that, as an example, four substrates, $W_i$, $W_{i+1}$, $W_{i+2}$, $W_{i+3}$, in the wafer cassette CR are subjected to a film-forming process according to the same recipe, in that order, in the process modules $PM_1$, $PM_2$, $PM_3$, $PM_4$, respectively. In this example, the first wafer $W_i$ is loaded from the load port LP through an outward route of $S_A \rightarrow S_B \rightarrow S_1$ into the process module $PM_1$. Next, the second wafer $W_{i+1}$ is loaded from the load port LP through another outward route of $S_A \rightarrow S_B \rightarrow S_2$ into the process module $PM_2$. Next, the third wafer $W_{i+2}$ is loaded from the load port LP through yet another outward route of $S_A \rightarrow S_B \rightarrow S_3$ into the process module $PM_3$. Finally, the fourth wafer $W_{i+3}$ is loaded from the loadport LP through a further outward route of $S_A \rightarrow S_B \rightarrow S_4$ into the process module $PM_4$.

After that, $W_i$, the first wafer that has been subjected to the above process, is returned from the process module $PM_1$ through a homeward route of $S_1 \rightarrow S_B \rightarrow S_A$ to the wafer cassette CR on the load port LP. Next, $W_{i+1}$, the second wafer that has been subjected to the above process, is returned from the process module $PM_2$ through another homeward route of $S_2 \rightarrow S_B \rightarrow S_A$ to the wafer cassette CR on the loadport LP. Next, $W_{i+2}$, the third wafer that has been subjected to the above process, is returned from the process module $PM_3$ through yet another homeward route of $S_3 \rightarrow S_B \rightarrow S_A$ to the wafer cassette CR on the loadport LP. Finally, $W_{i+3}$, the fourth wafer that has been subjected to the above process, is returned from the process module $PM_4$ through a further homeward route of $S_4 \rightarrow S_B \rightarrow S_A$ to the wafer cassette CR on the loadport LP.

When the first wafer $W_i$ is unloaded from the process module $PM_1$, the fifth wafer $W_{i+4}$ that has been transferred from the load port LP through the outward route of $S_A \rightarrow S_B \rightarrow S_1$ is swapped with the wafer $W_i$ by the pick-and-place operation and loaded into the process module $PM_1$. In addition, when the second wafer $W_{i+1}$ is unloaded from the process module $PM_2$, the sixth wafer $W_{i+5}$ that has been transferred from the load port LP through the outward route of $S_A \rightarrow S_B \rightarrow S_2$ is swapped with the wafer $W_{i+1}$ by the pick-and-place operation and loaded into the process module $PM_2$. When the third wafer $W_{i+2}$ is unloaded from the process module $PM_3$, the seventh wafer $W_{i+6}$ that has been transferred from the load port LP through the outward route of $S_A \rightarrow S_B \rightarrow S_3$ is swapped with the wafer $W_{i+2}$ by the pick-andplace operation and loaded into the process module $PM_3$. When the fourth wafer $W_{i+3}$ is unloaded from the process module $PM_4$, the eighth wafer $W_{i+7}$ that has been transferred in from the load port LP through the outward route of $S_A \rightarrow S_B \rightarrow S_4$ is swapped with the wafer $W_{i+3}$ by the pick-and-place operation and loaded into the process module $P_{M4}$.

Meanwhile, when the process recipe is changed in this processing system, "conditioning", which stops all intra-system substrate transfer operations between production lots and adjusts intra-module process conditions or parameters (e.g., the temperature of the susceptor, the inner-wall state of the chamber, and the like) to reference value or reference states, is performed in each process module $PM_1$, $PM_2$, $PM_3$, $PM_4$ for a considerable time in order to conform to a new process recipe. The time required for such conditioning usually varies between the process modules. That is to say, as discussed in the description of the Background Art, individual difference of the process modules causes variation in the time for conditioning (e.g., the time needed to raise the susceptor temperature from a set standby temperature to a set process temperature).

Figure 4:
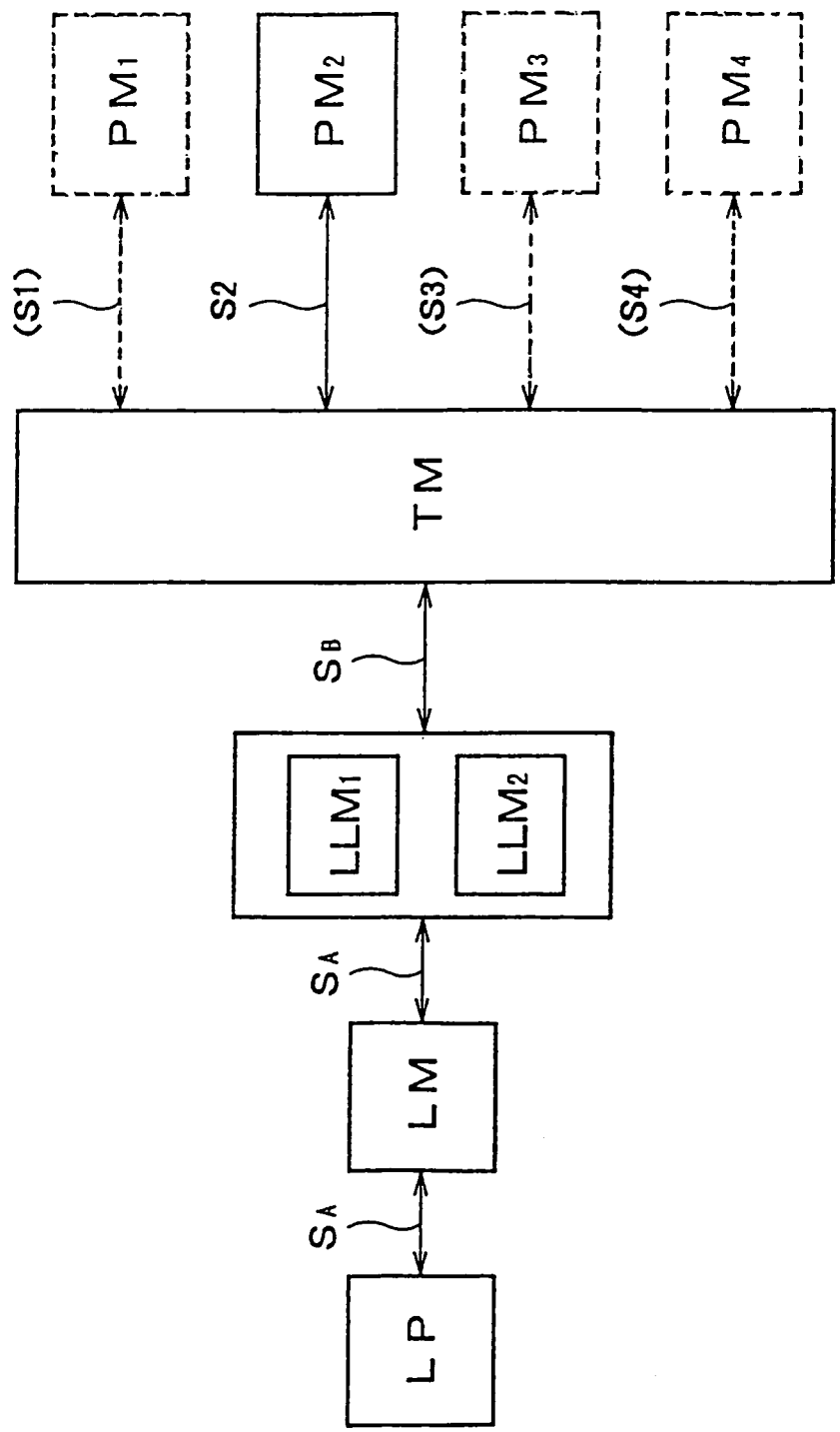
FIG. 4 is a diagram illustrating an operational phase associated with execution of a single process in the processing system.

When such conditioning is executed, the processing system uses the below-mentioned procedure to start the processes. Suppose that for example, $PM_2$ of the process modules $PM_1$, $PM_2$, $PM_3$, $PM_4$ has completed conditioning in the earliest timing. In this case, the module controller $MC_2$ of the process module $PM_2$ sends a state indicator signal ("ready" signal) to the equipment controller EC to notify the controller EC that conditioning has been completed. The equipment controller EC then notifies the transfer (atmospheric, vacuum transfer) module controllers $MC_T$, $MC_L$ of this state. Then the atmospheric transfer robot $RB_2$, the loadlock module ($LLM_1$, $LLM_2$), the vacuum transfer robot $RB_1$, and of course also the process module $PM_2$, start to operate under the control of the module controllers $MC_2$, $MC_T$, $MC_L$, and as shown in FIG. 4, substrate transfer is started on the transfer route of $S_A \rightarrow S_B \rightarrow S_2$. That is to say, unprocessed substrates $W_1$, $W_2$, $W_3$, $W_4$, etc. are sequentially loaded one by one at fixed time cycle from the wafer cassette CR on the load port LP, through the outward route of $S_A \rightarrow S_B \rightarrow S_2$ into the process module $PM_2$. The substrates $W_1$, $W_2$, $W_3$, $W_4$, after being subjected to processing, are sequentially returned, one by one at fixed time cycle from the process module $PM_2$ through the homeward route of $S_2 \rightarrow S_B \rightarrow S_A$ to the wafer cassette CR on the load port LP. At this time, the substrate $W_i$ that has undergone processing is unloaded from the process module $PM_2$ and in turn the next substrate $W_{i+1}$ is loaded into the process module $PM_2$, through the pick-and-place operation of the transfer robot $RB_1$.

Figure 5:
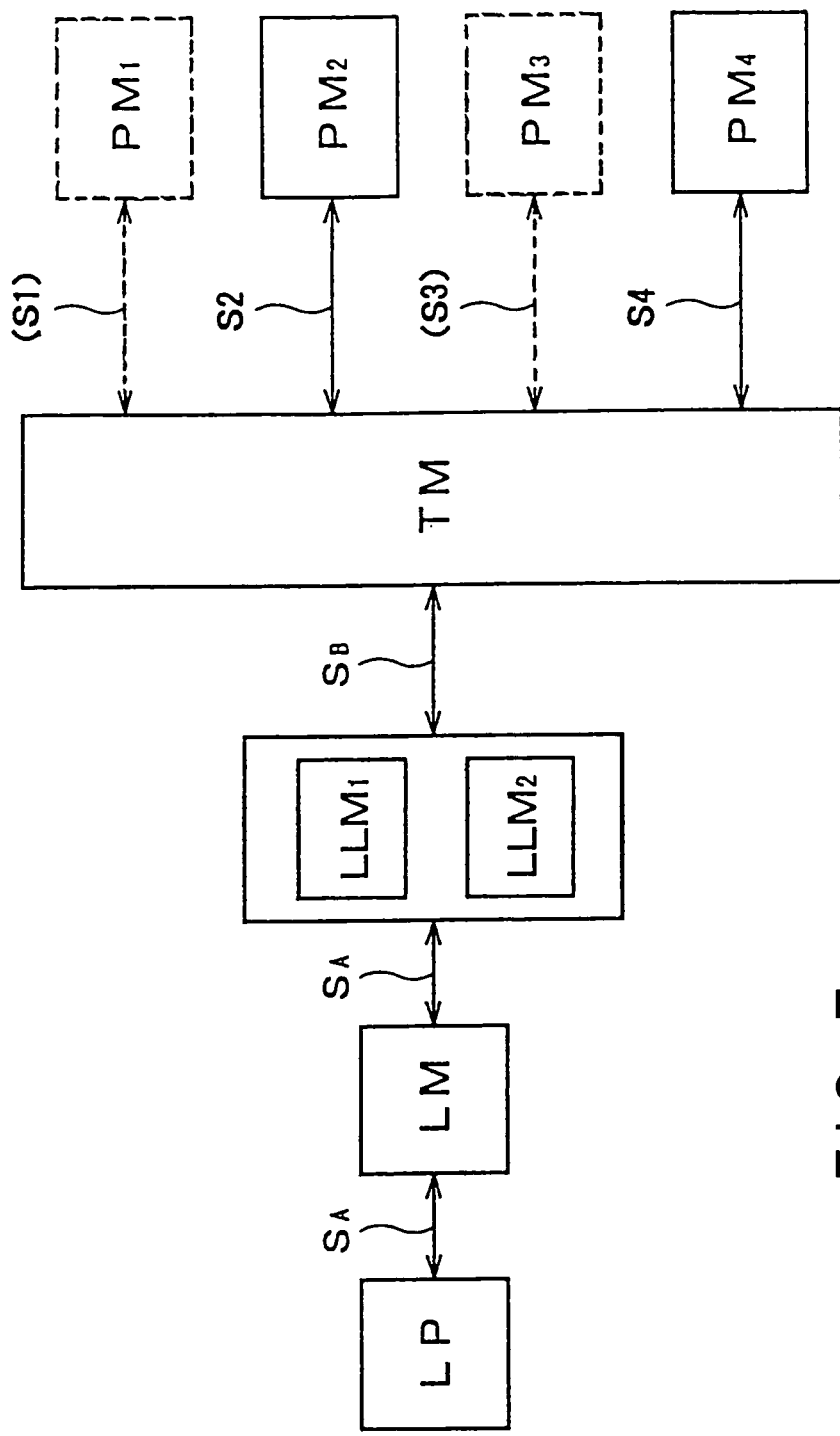
FIG. 5 is a diagram illustrating another operational phase associated with execution of a single process in the processing system.

Suppose that $PM_4$ has secondly completes conditioning shortly after the above. In this case, the ready signal is also sent from the module controller $MC_4$ of the process module $PM_4$ to the equipment controller EC, and this is notified to the transfer module controllers $MC_T$, $MC_L$ as well. In this way, the process module $PM_4$ starts operating and as shown in FIG. 5, the transfer route $S_A \rightarrow S_B \rightarrow S_4$ is also established. This means that the sole module operation of the process module $PM_2$ is switched to two-module parallel operation of the process modules $PM_2$, $PM_4$, and substrate transfer on the transfer route $S_A$-$S_B$-$S_4$ starts as well as on the transfer route $S_A$-$S_B$-$S_2$. In this case, during processing of a certain substrate $W_i$ in the process module $PM_2$, when the ready signal is sent from the process module $PM_4$, the next substrate $W_{i+1}$ can, if necessary, be shifted from the outward route $S_A$-$S_B$-$S_2$ to the transfer route $S_A$-$S_B$-$S_4$ and loaded into the process module $PM_4$. The substrate $W_{i+2}$ to follow the substrate $W_{i+1}$ in that case is transferred on the transfer route $S_A$-$S_B$-$S_2$, and the substrate $W_{i+3}$ to follow the substrate $W_{i+2}$ is transferred on the transfer route $S_A$-$S_B$-$S_4$. Such also applies to following substrates. The transfer on the transfer route $S_A$-$S_B$-$S_4$ is periodically performed with a predetermined delay in timing behind the transfer on the transfer route $S_A$-$S_B$-$S_2$. When a new transfer route is established after that, transfer on the new transfer route will be periodically performed with a predetermined delay in timing behind the transfer on the existing transfer route.

Figure 6:
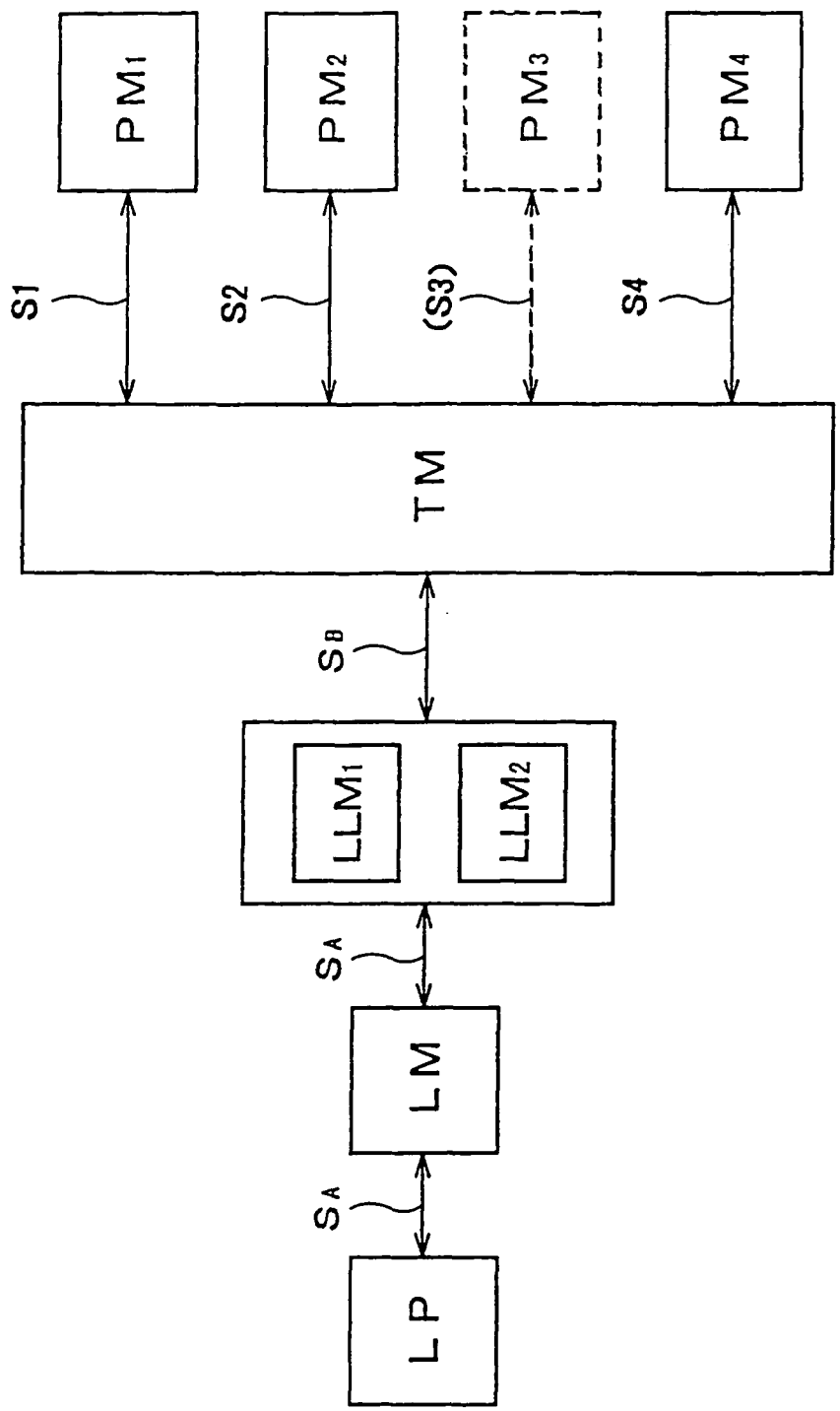
FIG. 6 is a diagram illustrating yet another operational phase associated with execution of a single process in the processing system.

Suppose that process module $PM_1$ has thirdly completes conditioning. In this case, the ready signal is also sent from the module controller $MC_1$ of the process module $PM_1$ to the equipment controller EC, and this is notified to the transfer module controllers $MC_T$, $MC_L$ as well. In this way, the process module $PM_1$ starts operating and as shown in FIG. 6, the transfer route $S_A$-$S_B$-$S_1$ is also established. This means that the two-module parallel operation of the process modules $PM_2$, $PM_4$ is switched to three-module parallel operation of the process modules $PM_2$, $PM_4$, $PM_1$, and thus that substrates are transferred on the transfer route $S_A$-$S_B$-$S_1$ as well as on the transfer routes $S_A$-$S_B$-$S_2$ and $S_A$-$S_B$-$S_4$. In this case, during processing of certain substrates $W_i$, $W_{i+1}$ in the respective process modules $PM_2$, $PM_4$, when the ready signal is sent from the process module $PM_1$, the next substrate $W_{i+2}$ can, if necessary, be shifted from the outward route $S_A$-$S_B$-$S_2$ to the transfer route $S_A$-$S_B$-$S_1$ and loaded into the process module $PM_1$. The substrate $W_{i+3}$ to follow the substrate $W_{i+2}$ in that case is transferred on the transfer route $S_A$-$S_B$-$S_2$, the substrate $W_{i+4}$ to follow the substrate $W_{i+3}$ is transferred on the transfer route $S_A$-$S_B$-$S_4$, and the substrate $W_{i+5}$ to follow the substrate $W_{i+4}$ is transferred on the transfer route $S_A$-$S_B$-$S_1$.

Suppose that process module $PM_3$ finally completes conditioning. After that, as shown in FIG. 3, four process modules (process modules) operate in parallel and substrates are transferred on four transfer routes, namely, $S_A$-$S_B$-$S_2$, $S_A$-$S_B$-$S_4$, $S_A$-$S_B$-$S_1$, and $S_A$-$S_B$-$S_3$. In this example, the substrates are transferred to or loaded into/unloaded from $PM_2$, $PM_4$, $PM_1$, $PM_3$, in that order.

In the present embodiment, when conditioning of any one of the process modules $PM_1$, $PM_2$, $PM_3$, $PM_4$ is completed before the start of the actual process, in other words, when any one of the transfer routes $S_A$-$S_B$-$S_1$, $S_A$-$S_B$-$S_2$, $S_A$-$S_B$-$S_3$, $S_A$-$S_B$-$S_4$ in the system is established, substrate transfer is immediately started on the particular transfer route and the corresponding process module PM repeat a single-wafer process operation at fixed time cycle. This makes it possible to effectively use resources operable inside the system, and thus to improve productivity.

Starting the transfer of substrates on each transfer route in the present embodiment means that completion of conditioning is followed by starting the transfer of the first substrate W for loading into any process module on the transfer route; the substrate W may stand by at any position in an associated transfer region, that is, at any position in either the loadport LP, the loader module LM, the loadlock module ($LLM_1$, $LLM_2$), or the transfer module TM, up until the start of the transfer. Therefore, in the above example, when the process module $PM_4$ completes conditioning in the second earliest timing, if the next substrate $W_{i+1}$ that remains unprocessed is standing by in the transfer module TM, that is, on the transfer arm of the vacuum transfer robot $RB_1$, the substrate transfer on the transfer route $S_A \to S_B \to S_4$ can be started and the substrate $W_{i+1}$ loaded into the process module $PM_4$.

Figure 7:
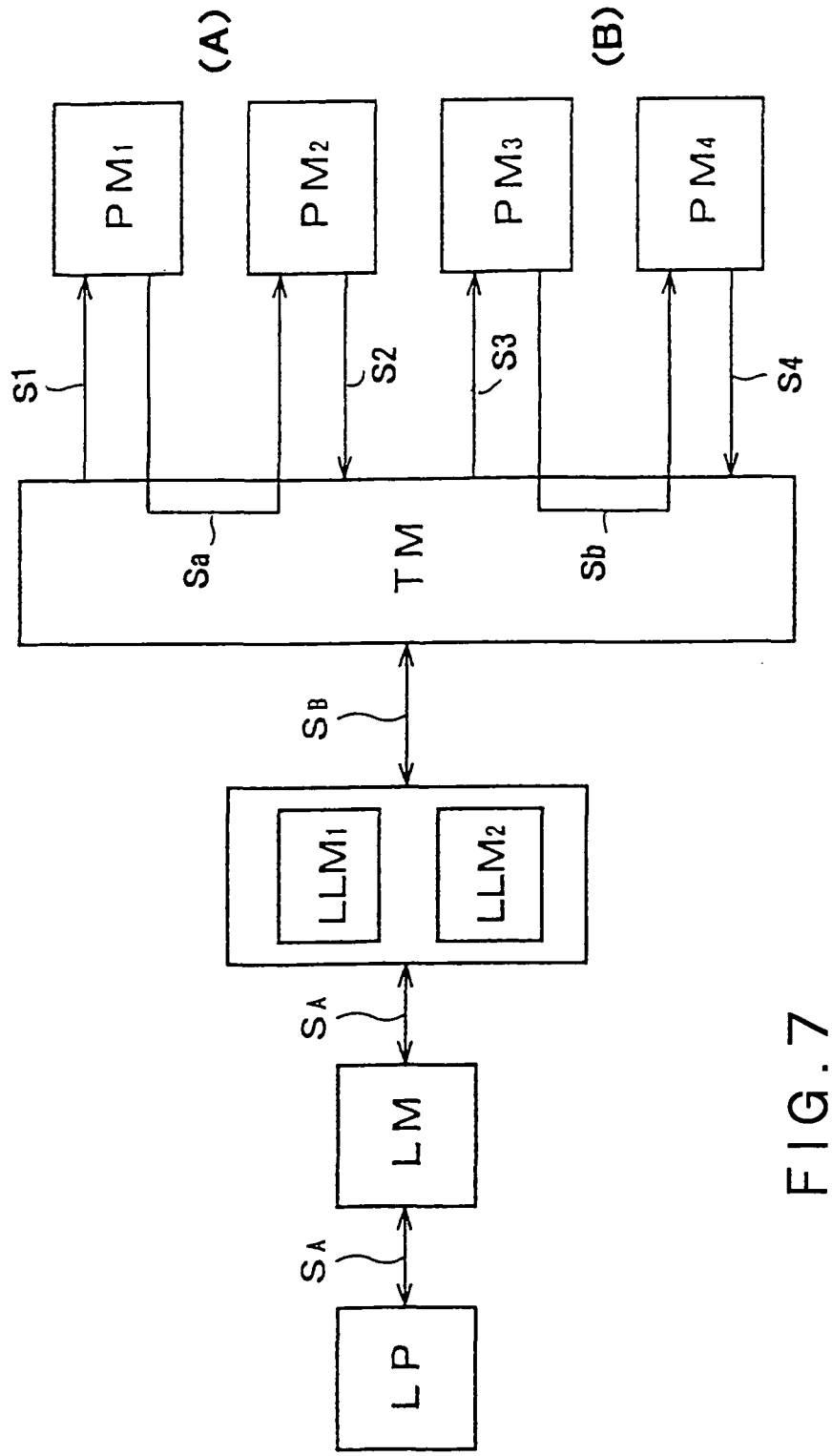
FIG. 7 is a diagram illustrating a first example of an operation associated with execution of a composite process in the processing system.
Figure 8:
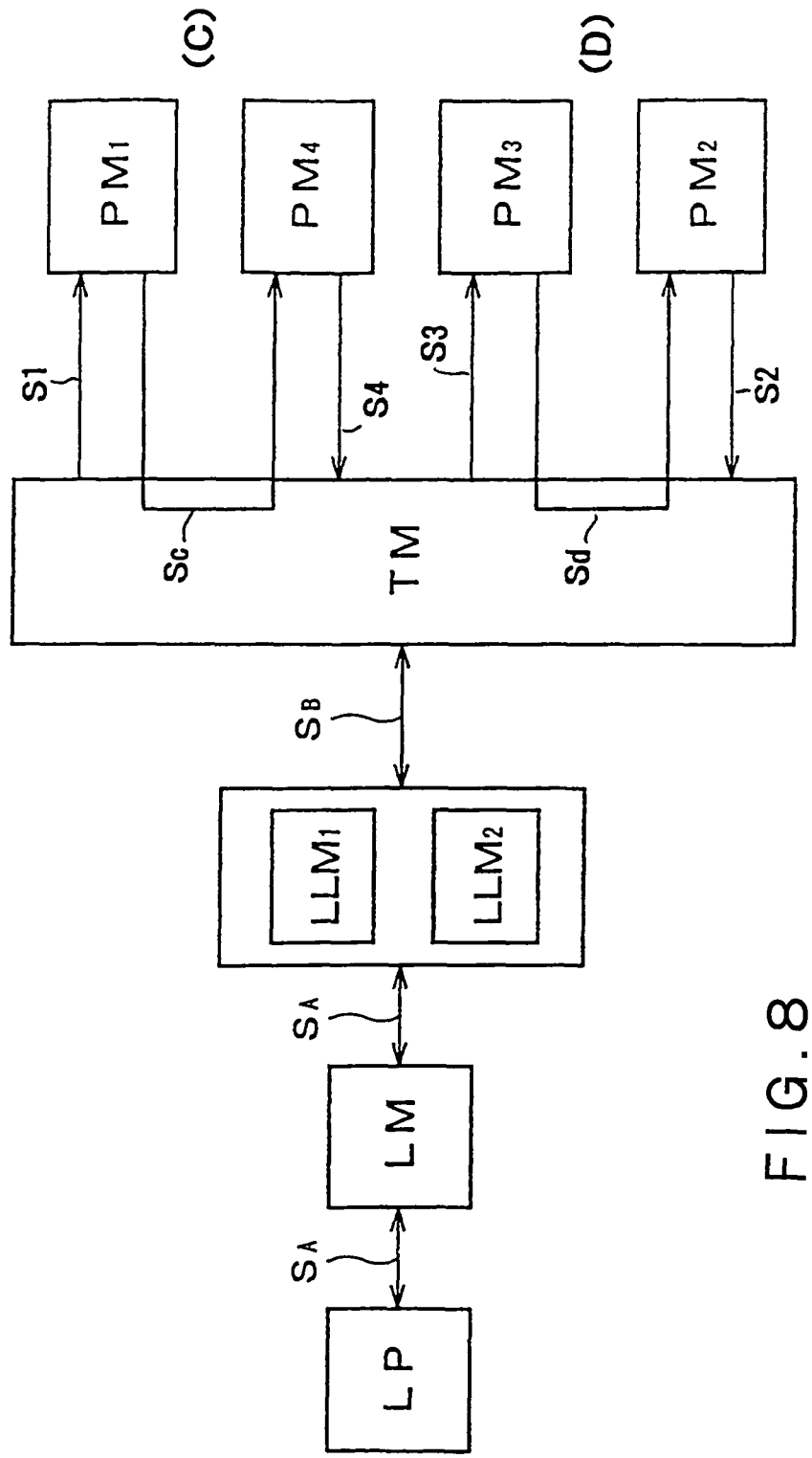
FIG. 8 is a diagram illustrating a second example of an operation associated with execution of a composite process in the processing system.

In the cluster tool type of processing system, two sets of process modules may respectively perform a composite process according to the same recipe in parallel fashion. For instance, in an application that employs in-line sequential deposition procedure to form stacked Ti/TiN films which is used as a barrier metal in a Si process, CVD apparatuses for forming the Ti film as a lower layer can be used as the process modules $PM_1$, $PM_3$, and CVD apparatuses for forming the TiN film as an upper layer can be used as the process modules $PM_2$, $PM_4$. In this case, there are two types of process module combination patterns, that is, as shown in FIG. 7, a combination pattern of [$PM_1 \to PM_2$], [$PM_3 \to PM_4$], and as shown in FIG. 8, a combination pattern of [$PM_1 \to PM_4$], [$PM_3 \to PM_2$]. It is possible to fixedly use any one of the two types of combination patterns. In the present embodiment, however, both two types are selectable and either one of the combination patterns is conditionally determined in accordance with the order of a completion time of conditioning, as described below.

In the example of FIG. 7, a one-way transfer route $S_1 \to S_a \to S_2$, along which the vacuum transfer robot $RB_1$ of the transfer module TM transfers substrates one by one, is set between the loadlock module ($LLM_1$, $LLM_2$) and a process module pair (process module set) [$PM_1 \to PM_2$] (for convenience's sake, this pair is referred to as "pair A"). In this example, $S_1$ is an outward transfer route extending from the loadlock module ($LLM_1$, $LLM_2$) to the process module $PM_1$ for execution of a first process step, $S_a$ is a transfer route extending for wafer transfer from the process module $PM_1$ to the process module $PM_2$ for execution of a second process step, and $S_2$ is a homeward transfer route extending from the process module $PM_2$ to the loadlock module ($LLM_1$, $LLM_2$).

An unprocessed wafer $W_i$ is loaded from the loadlock module ($LLM_1$, $LLM_2$) via the transfer route $S_1$ into the process module $PM_1$, where the wafer then undergoes the first process step (Ti deposition process). After completion of the first process step, the wafer $W_i$ is transferred from the process module $PM_1$ via the transfer route $S_a$ to the process module $PM_2$, where the wafer then undergoes the second process step (TiN deposition process). After completion of the second process step, the wafer $W_i$ is returned from the process module $PM_1$ via the transfer route $S_2$ to the loadlock module ($LLM_1$, $LLM_2$). In each process module $PM_1$, $PM_2$, wafers may be unloaded/loaded by the pick-and-place operation of the transfer robot.

Additionally, in the case of FIG. 7, a one-way transfer route $S_3 \to S_b \to S_4$, along which the vacuum transfer robot $RB_1$ of the transfer module TM transfers substrates one by one, is set between the loadlock module ($LLM_1$, $LLM_2$) and the other process module pair (process module set) [$PM_3 \to PM_4$] (for convenience's sake, this pair is referred to as "pair B"). In this example, $S_3$ is an outward transfer route extending from the loadlock module ($LLM_1$, $LLM_2$) to the process module $PM_3$ for execution of the first process step, $S_b$ is a transfer route extending for wafer transfer from the process module $PM_3$ to the process module $PM_4$ for execution of the second process step, and $S_4$ is a homeward transfer route extending from the process module $PM_4$ to the loadlock module ($LLM_1$, $LLM_2$).

An unprocessed wafer $W_i$ is loaded from the loadlock module ($LLM_1$, $LLM_2$) via the transfer route $S_3$ into the process module $PM_3$, where the wafer then undergoes the first process step (Ti deposition process). After completion of the first process step, the wafer $W_i$ is loaded from the process module $PM_3$ via the transfer route $S_b$ into the process module $PM_4$, where the wafer then undergoes the second process step (TiN deposition process). After completion of the second process step, the wafer $W_i$ is returned from the process module $PM_4$ via the transfer route $S_4$ to the loadlock module ($LLM_1$, $LLM_2$). In each process module $PM_3$, $PM_4$, wafers may be unloaded/loaded by successive pick-and-place operations.

In the example of FIG. 7, as an overall transfer pattern, substrates W that have been loaded from the wafer cassettes CR on the loadport LP, via the atmospheric transfer route $S_A$-$S_B$ into the loadlock module ($LLM_1$, $LLM_2$), are split, every other piece, into two groups with a definite time difference in a vacuum space. One group successively undergoes the first and second process steps, in-line, in process module pair A [$PM_1 \rightarrow PM_2$] via the transfer route $S_1 \rightarrow S_a \rightarrow S_2$, and the other group successively undergoes the first and second process steps, in-line, in process module pair B [$PM_3 \rightarrow PM_4$] via the transfer route $S_3 \rightarrow S_b \rightarrow S_4$. Each substrate that has been returned into the loadlock module ($LLM_1$, $LLM_2$) is returned therefrom to the wafer cassettes CR on the loadport LP via the atmospheric transfer route $S_A$-$S_B$.

In the example of FIG. 8, a one-way transfer route $S_1 \rightarrow S_c \rightarrow S_2$, along which the vacuum transfer robot $RB_1$ of the transfer module TM transfers substrates one by one, is set between the loadlock module ($LLM_1$, $LLM_2$) and one process module pair [$PM_1 \rightarrow PM_4$] (for convenience's sake, this pair is referred to as "pair C"). In this example, $S_1$ is an outward transfer route extending from the loadlock module ($LLM_1$, $LLM_2$) to the process module $PM_1$ for execution of the first process step, $S_c$ is a transfer route extending for wafer transfer from the process module PM1 to the process module $PM_4$ for execution of the second process step, and $S_4$ is a homeward transfer route extending from the process module $PM_4$ to the loadlock module ($LLM_1$, $LLM_2$).

Additionally, in FIG. 8, another one-way transfer route $S_3 \rightarrow S_d \rightarrow S_2$, along which the vacuum transfer robot $RB_1$ of the transfer module TM transfers substrates one by one, is set between the loadlock module ($LLM_1$, $LLM_2$) and the other process module pair [$PM_3 \rightarrow PM_2$] (for convenience's sake, this pair is referred to as "pair D"). In this example, $S_3$ is an outward transfer route extending from the loadlock module ($LLM_1$, $LLM_2$) to the process module $PM_3$ for execution of the first process step, $S_d$ is a transfer route extending for wafer transfer from the process module $PM_3$ to the process module $PM_2$ for execution of the second process step, and $S_2$ is a homeward transfer route extending from the process module $PM_2$ to the loadlock module ($LLM_1$, $LLM_2$).

The combination pattern in FIG. 8 is equivalent to a combination pattern obtained by modifying the combination pattern in FIG. 7 by exchanging the process modules $PM_2$ and $PM_4$ for the second process step. Therefore, the transfer pattern in FIG. 8 is also equivalent to a transfer pattern obtained by modifying the transfer pattern in FIG. 7 by exchanging the process modules $PM_2$ and $PM_4$.

As described above, when multiple pairs (sets) of process modules performs the composite process of the same recipe in parallel, conditioning also performed in each process module individually, for which reason the completion time of conditioning varies. Thus, the processing system starts the actual process in the sequence below.

Figure 9:
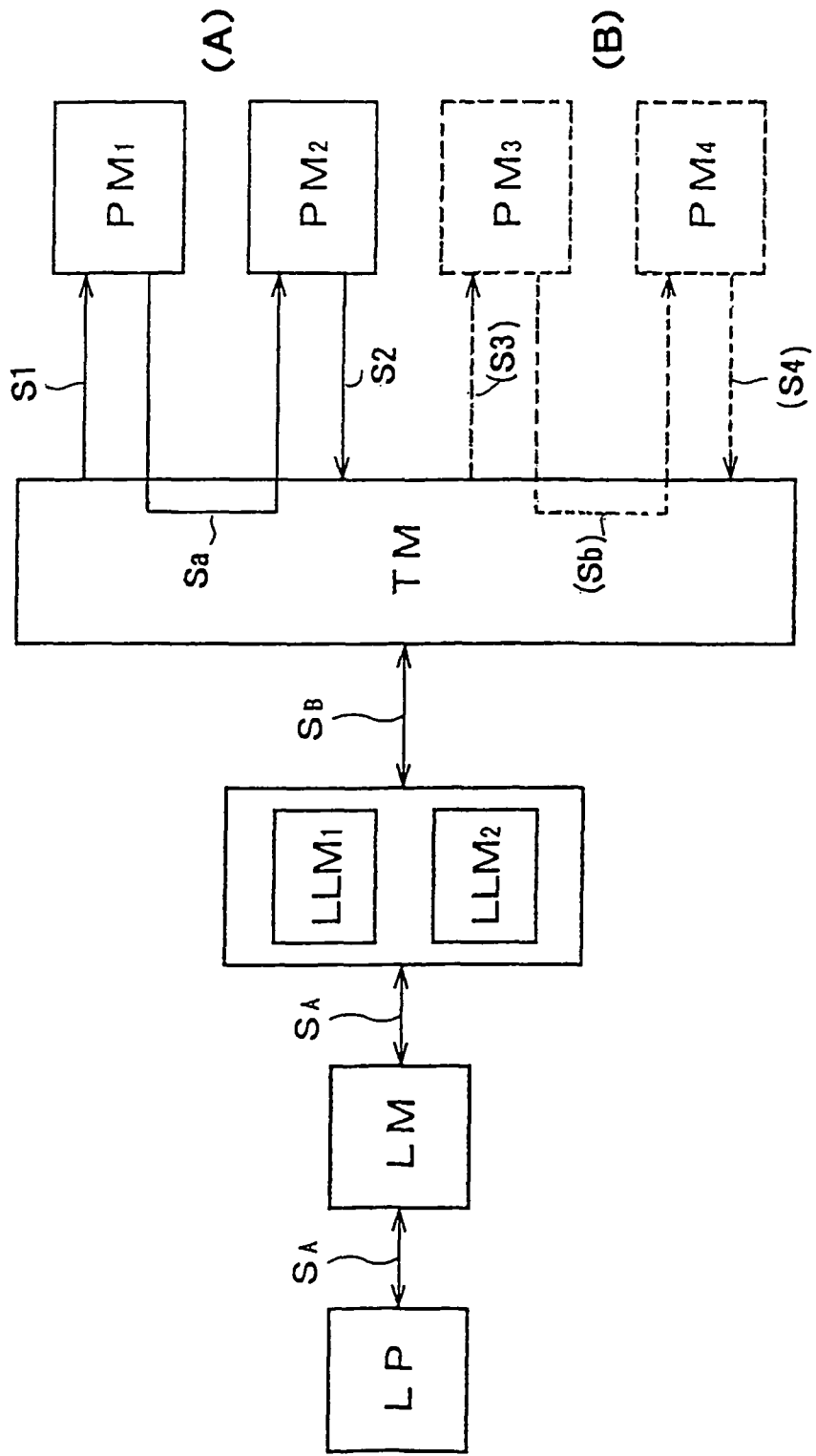
FIG. 9 is a diagram illustrating a phase of the operation in the first example of FIG. 7.

Assume that for example, the process module $PM_1$ among the process modules $PM_1$, $PM_2$, $PM_3$, $PM_4$ has completed conditioning in the earliest timing. At this point of time, since conditioning of the process modules $PM_2$, $PM_4$ is for execution of the second process step is still in progress, the process module $PM_1$ is made to stand by intact. When conditioning of one of the process modules $PM_2$, $PM_4$, for example, $PM_2$, is completed, process module pair A [$PM_1 \rightarrow PM_2$] is established and substrate transfer is started on the transfer route $S_A$-$S_B$-($S_1 \rightarrow S_a \rightarrow S_2$) as shown in FIG. 9. This allows the processing system to perform the in-line composite process (forming the stacked Ti/TiN film) to wafers W in the wafer cassette CR one by one by means of process module pair A [$PM_1 \rightarrow PM_2$].

Hereafter, even after one of the remaining process modules $PM_3$, $PM_4$ has completed conditioning, an operational state in which only one system of the process modules $PM_1$, $PM_2$ in pair A is in operation is continued intact, and finally, when conditioning by the other of the remaining process modules $PM_3$, $PM_4$ is completed, substrate transfer is also started on the transfer route $S_A$-$S_B$-($S_3 \rightarrow S_b \rightarrow S_4$), whereby process module pair B of [$PM_3 \rightarrow PM_4$] is operated. However, if it is estimated that when the process module $PM_3$ completes conditioning earlier than the process module $PM_4$, conditioning of the process module $PM_4$ will be completed during the first execution of the first process step (Ti deposition) in the process module $PM_3$, conditioning of the process module $PM_4$ may be regarded as having been completed before conditioning of the process module $PM_4$ is completed. In that case, it is possible to start the operation of the process module $PM_3$ and the substrate transfer on the transfer route $S_A$-$S_B$-($S_3$-$S_b$-$S_4$). In this way, dual-system all-operation mode with both process module pair A [$PM_1 \rightarrow PM_2$] and process module pair B [$PM_3 \rightarrow PM_4$] in operation will be established sooner or later, and the processing system cyclically repeats the transfer operation of each section thereof in the transfer pattern described above in connection with FIG. 7.

The equipment controller EC performs the above estimation through the module controller $MC_4$ of the process module $PM_4$. More specifically, on the basis of information on a recipe defining detailed process of conditioning (prologue recipe, or preprocessing recipe), the module controller $MC_4$ performs analysis of progress of conditioning in the process module $PM_4$ step by step, computes a residual time $T_R$ left until completion of conditioning, and successively renews the residual time. The equipment controller EC receives constantly changing residual time $T_R$ data from the module controller $MC_4$ in real time, then compares the received residual time $T_R$ data with a reference time or a specified time $T_S$, and when the residual time $T_R$ decreases below the specified time $T_S$, the substrate transfer on the transfer route $S_A$-$S_B$-($S_3 \rightarrow S_b \rightarrow S_4$) is started.

During the above estimation, the equipment controller EC monitors through the transfer module controllers $MC_T$, $MC_L$, the position of an unprocessed substrate W standing by in the transfer region, that is, in either the loadport LP, the loader module LM, the loadlock module ($LLM_1$, $LLM_2$), or the transfer module TM, and calculates a first transfer time $T_a$ necessary for loading of the substrate W from the standby position thereof into the process module $PM_3$ for execution of the first process step of the process module pair B. A recipe time $T_b$ for which the substrate W will stay in the process module $PM_3$ to undergo the first process step, and a second transfer time $T_c$ necessary for the substrate having been completed the stay in the process module $PM_3$ to be unloaded from the process module $PM_3$ are added to the first transfer time $T_a$, thereby to derive a minimum time requirement ($T_a$+$T_b$+$T_c$). A specified time $T_S$ longer than the minimum time required is next determined. The minimum time required can usually be directly used as the specified time $T_S$. Thus, immediately after conditioning in the process module $PM_4$, the substrate W that has just gone through the first cycle of the first process in the process module $PM_3$ can be loaded into the process module $PM_4$ without spending an unnecessary waiting time.

If the unprocessed substrate W standing by in the transfer region (from the loadport LP to the transfer module TM) moves, since the first transfer time $T_a$ changes according to a particular new position of the substrate W, the specified time $T_S$ requires renewal with each change in $T_a$. If there are a plurality of unprocessed substrates W standing by in the transfer region (from the loadport LP to the transfer module TM) moves, one substrate W to be used as a judgment basis for the above estimation may be selected in accordance with required selection criteria, or after selection of multiple substrates W and calculation of specified time $T_S$ data for each selected substrate W, one of the calculated $T_S$ value may be adopted in accordance with required judging conditions.

The residual time $T_R$ during conditioning in the process module decreases with time. Meanwhile, those unprocessed substrates W standing by in the transfer region that are positioned closer to an upstream end are each longer in the first transfer time $T_a$ and takes a greater $T_S$ value. Therefore, the residual time $T_R$ usually first decreases below the specified time $T_S$ associated with the substrate W standing by in the uppermost position at the upstream side, so this substrate W can be used as the judgment basis for the above estimation. At a starting time of monitoring of the residual time $T_R$ for substrates in the remaining process module $PM_4$ that does not yet complete conditioning, however, the particular residual time $T_R$ is likely to have already decreased below the specified time $T_S$ associated with the substrates W standing by at the upstream side. In such a case, the substrate W at a downstream side that takes a maximum value of specified data smaller than the residual time $T_R$ can be used as the judgment basis for the above estimation.

The above estimation can also be applied to starting the substrate transfer on the transfer route $S_A$-$S_B$-($S_1 \rightarrow S_a \rightarrow S_2$) associated with the process module pair A [$PM_1 \rightarrow PM_2$] that operates in advance. That is to say, if, as in the above example, $PM_1$ for the first process is the process module that has completed conditioning in the earliest timing, the equipment controller EC compares the residual time $T_R$ in each of the process modules $PM_2$, $PM_4$ via the module controllers $MC_2$, $MC_4$, and selects the shorter residual time $T_R$ (in the above example, $T_R$ of the process module $PM_2$). In addition, the substrate transfer on the transfer route $S_A$-$S_B$-($S_1 \rightarrow S_a \rightarrow S_2$) can be started when the particular residual time $T_R$ decreases below the specified time $T_S$ associated with the substrate W standing by at the most downstream position.

Figure 10:
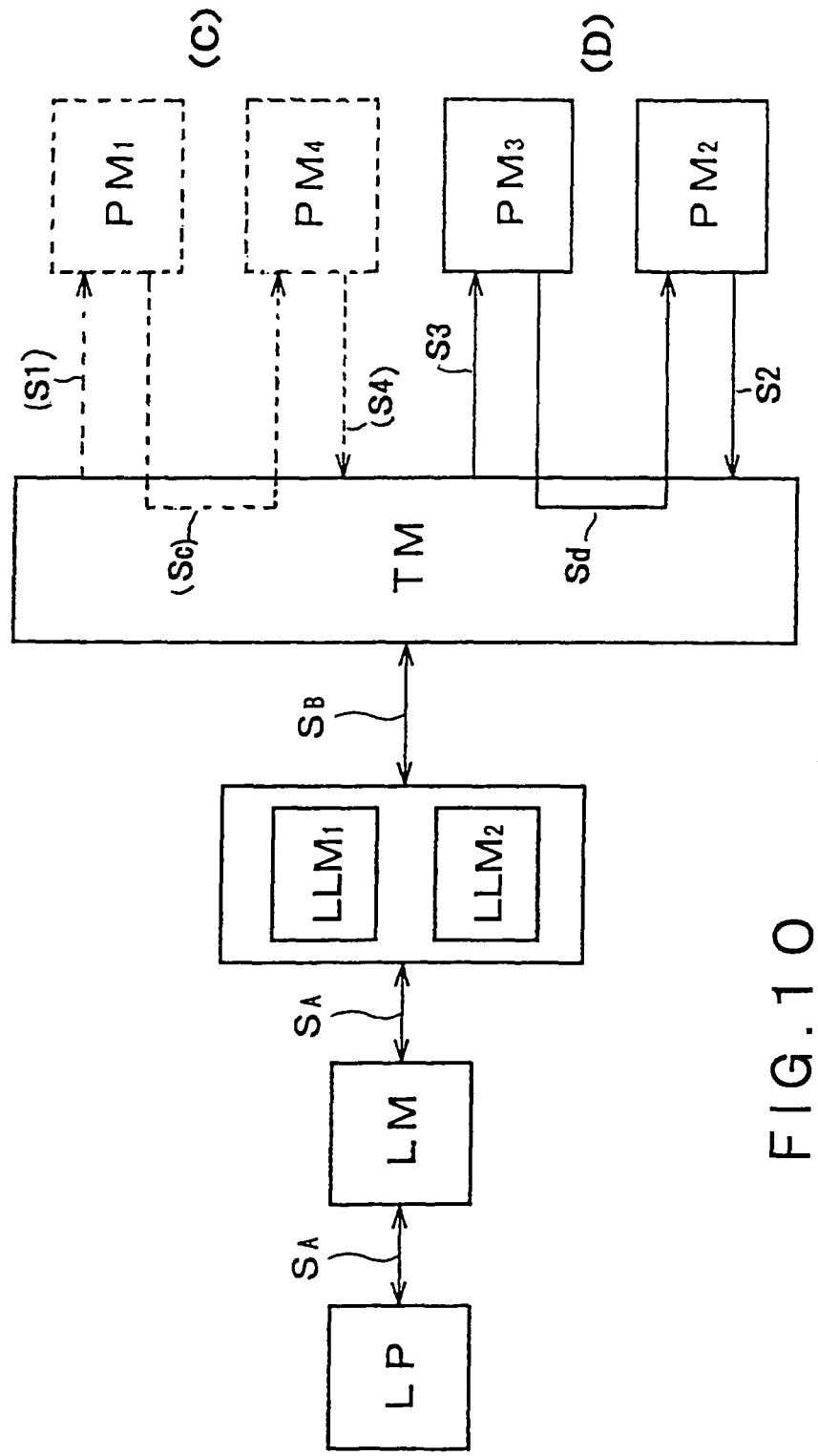
FIG. 10 is a diagram illustrating a phase of the operation in the second example of FIG. 8.

If, in the above example, conditioning of the process modules $PM_3$, $PM_2$, $PM_1$, $PM_4$ is completed in that order, substrate transfer may be started on the transfer route $S_A$-$S_B$-($S_3 \rightarrow S_d \rightarrow S_2$) by, as shown in FIG. 10, establishing process module pairing D of [$PM_3 \rightarrow PM_2$] when conditioning of $PM_3$, $PM_2$ is completed. After that, upon completion of conditioning of $PM_1$, $PM_2$, substrate transfer can also be started on the transfer route $S_A$-$S_B$-($S_1 \rightarrow S_c \rightarrow S_4$) in order to operate process module pair C [$PM_1 \rightarrow PM_4$]. As a result, all modules and all transfer mechanism inside the system operate in the combination pattern and transfer pattern of FIG. 8.

In addition, if, in the above example, conditioning of the process modules $PM_3$, $PM_1$, $PM_4$, $PM_2$ is completed in that order, substrate transfer can be started on the transfer route $S_A$-$S_B$-($S_3 \rightarrow S_b \rightarrow S_4$) or the transfer route $S_A$-$S_B$-($S_1 \rightarrow S_c \rightarrow S_4$) by, combining either $PM_3$ or $PM_1$ and $PM_4$ upon completion of conditioning by $PM_4$, and establishing process module pair B [$PM_3 \rightarrow PM_4$] or process module pair C of [$PM_1 \rightarrow PM_4$]. In this case, if process module pair B [$PM_3 \rightarrow PM_4$] is established and the substrate transfer on the transfer route $S_A$-$S_B$-($S_3 \rightarrow S_b \rightarrow S_4$) is started, when conditioning of $PM_2$ is completed after that, process module pair A [$PM_1 \rightarrow PM_2$] is established, at which time the substrate transfer on the transfer route $S_A$-$S_B$-($S_1 \rightarrow S_a \rightarrow S_2$) is added. As a result, all internal modules and all internal transfer mechanism of the system in the combination pattern and transfer pattern of FIG. 7 operate at full capacity. Furthermore, if process module pair C [$PM_1 \rightarrow PM_4$] is established upon completion of conditioning in $PM_4$, and the substrate transfer on the transfer route $S_A$-$S_B$-($S_1 \rightarrow S_c \rightarrow S_4$) is started, when conditioning of $PM_2$ is completed after that, process module pair D [$PM_3 \rightarrow PM_2$] is established, at which time the substrate transfer on the transfer route $S_A$-$S_B$-($S_3 \rightarrow S_d \rightarrow S_2$) is added. As a result, all internal modules and all internal transfer mechanism of the system in the combination pattern and transfer pattern of FIG. 8 operate.

There are also many other completion patterns of conditioning of the process modules $PM_1$, $PM_2$, $PM_3$, $PM_4$. In all of these patterns, when conditioning by at least one of the process modules $PM_1$, $PM_3$ for the first process step and at least one of the process modules $PM_2$, $PM_4$ for the second process step is completed, one process module pair capable of executing the in-line composite process is organized by the process modules that have completed conditioning, and substrate transfer is started on the associated transfer routes. Next after the last (fourth) process module has completed conditioning, the remaining pair of process modules is operated and substrate transfer is also started on the associated transfer routes. This makes it possible to effectively use the resources operable inside the system, and thus to improve productivity.

The cluster tool, to which the present invention is applied, is not limited to that of the above-described embodiment (FIG. 1) having the illustrated configuration, and may be changed or modified in various forms in terms of layout, system component configuration, and the like. For example, the dual-juxtaposed loadlock modules ($LLM_1$, $LLM_2$) in the above embodiment have been constructed to be able not only to hold outward (unprocessed) wafers W, one by one in the module ($LLM_1$, $LLM_2$) and hold homeward (processed) wafers W one by one therein, but also to hold the outward wafers W and the homeward wafers W at the same time. However, the form of providing loadlock modules between the atmospheric transfer route and the vacuum transfer route is arbitrary. In addition, it is possible to adopt a configuration that includes loadlock modules common to all transfer routes. Furthermore, it is possible to adopt a configuration that includes dedicated loadlock modules for each transfer route.

Figure 11:
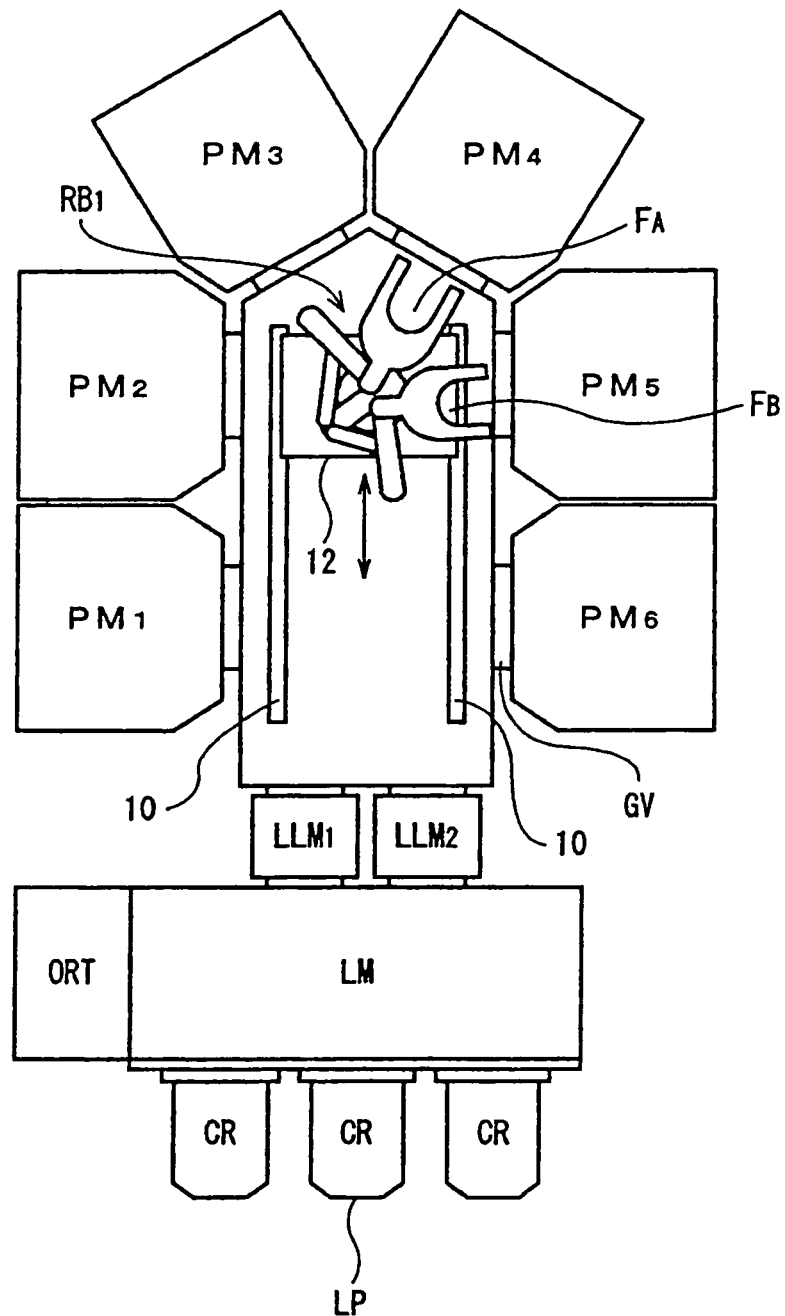
FIG. 11 is a schematic plan view showing a configuration of a processing system according to another embodiment of the present invention.

Moreover, it is possible, by extending the transfer module TM in a horizontal direction as shown in FIG. 11, to adopt a configuration including a larger number of process modules (in the example of FIG. 11, six units) connectible to the transfer module TM, that is, operable inside the cluster tool. In this example, two rails 10 extending longitudinally in the transfer module TM are laid out and the transfer robot $RB_1$ has a slider 12 linearly movable along the rails 10. In addition, this transfer robot $RB_1$ has a pair of transfer arms $F_A$, $F_B$ both expandable in two directions at an acute angle (e.g., 60 degrees) with respect to each other, and has a feature in that pivoting angles of both transfer arms $F_A$, $F_B$ can be reduced when sequentially inserted into each module by pick-and-place operation.

In the cluster tool of FIG. 11, all or part of the six process modules $PM_1$ to $PM_6$ can be made to perform a single process in parallel fashion according to a recipe fully or partially common to all process modules. Two or three pairs (sets) of process modules to be made to perform a composite process in parallel fashion with a recipe common to part or all of the process modules can be organized as an alternative pattern. In both of the above organizing patterns, a technique for starting the transfer of substrates on substrate transfer routes can be applied in the above pre-reading scheme.

In particular, to configure one set of composite processes with a first process module, second process module, and third process module assigned to continuously perform processing in order, if the third process module is the last module that does not yet complete conditioning, the residual time $T_R$ is monitored in real time for substrates in the third process module, and then when the residual time $T_R$ decreases below the specified time $T_S$ associated with any unprocessed substrates standing by in the transfer region, the substrate transfer on the particular transfer routes may be started.

In that case, a first transfer time to a start of loading of the substrate from the standby position into the process module for the first process, a first recipe time for which the substrate W will stay in the first process module in order to undergo the first process, a second transfer time necessary for the substrate W that has completed the stay in the first process module to be unloaded therefrom and then loading into the process module for the second process, a second recipe time for which the substrate W will stay in the second process module in order to undergo the second process, and a third transfer time necessary for the substrate W that has completed the stay in the second process module to be unloaded therefrom are added to calculate a minimum time required, and the specified time $T_S$ may be determined in a range of at least the minimum time required.

In the above embodiment, the vacuum transfer robot $RB_1$ in the transfer module TM and the atmospheric transfer robot $RB_2$ in the loader module LM are controlled by independent transfer module controllers $MC_T$, $MC_L$, respectively. However, the vacuum transfer robot $RB_1$ and the atmospheric transfer robot $RB_2$ can be controlled simultaneously or in parallel form by one controller. Similarly, all process module controllers $MC_1$, $MC_2$, $MC_3$, $MC_4$ may be controllable by one controller.

The processing system of the present invention is not limited to such a vacuum processing system as in the above embodiment, and the present invention can also be applied to a system partly or totally including an atmospheric processing section. In addition, the kinds of objects to be subjected to processing are not limited to semiconductor wafers and can be various substrates for flat-panel display use, photomasks, CD substrates, printed circuit/wiring boards, and more.

The invention claimed is:

1. A processing system comprising:
   a plurality of process modules of plural types, wherein the same number process modules belong to each type such that plural sets of process modules, each set including of one process module of each type are made to perform a composite process composed of a series of processes to a substrate;
   a transfer system including a first transfer module and configured to transfer each of plural substrates from a cassette containing the plural substrates to any one of the process modules, wherein the plurality of process modules are connected to a peripheral region of the first transfer module; and
   a controller that controls operation of the transfer System and the process modules, wherein the controller is configured to:
   (a) monitor a conditioning status of each process module after each process module begins conditioning;
   (b) immediately after at least one process module of each type has completed conditioning to become a conditioning-completed module, make up a first set of conditioning-completed process modules by selecting one conditioning-completed module of each type, and start transferring one of the substrates along a first transfer path for transferring the one substrate to the first set of process modules, and start performing the composite processes by use of the process modules of the first set;
   (c) thereafter, immediately after at least one process module of each type, among the processing modules which do not yet belong to a set of process modules, has completed the conditioning to become a conditioning-completed module, make up another set of conditioning-completed process modules by selecting one conditioning-completed module of each type and start transferring of another of the substrates along another transfer path for transferring the another substrate to said another set of process modules, and start performing the composite processes by use of process modules of said another set;
   (d) repeat (c) until there is no conditioning-completed module that does not belong to a set; and
   (e) thereafter, perform the composite process to the plurality of substrates, while distributing the substrates to any one of the process module sets whereby each substrate is transferred to and processed only by the process modules of the set to which the substrate is distributed.

2. The processing system according to claim 1, wherein:
   the controller controls the operation of the transfer system and the process modules such that after two or more sets of process modules have been established, unprocessed substrates are loaded in fixed order and at fixed time cycle into the process modules of the set, along transfer routes associated with the process modules of respective sets, and such that processed substrates are successively unloaded from the process modules of the respective sets having finished the composite process, onto the transfer routes associated with the process modules of respective sets.

3. The processing system according to claim 1, wherein:
   the composite process is composed of a first process which is an earlier process and a second process which is a later process; and
   the process modules of each of the sets comprise any one of process modules of a first group of a first type for performing the first process and any one of process modules of a second group of a second type for performing the second process.

4. The processing system according to claim 3, wherein the controller is configured such that:
   if one of plural first process modules belonging to the first group completes conditioning earlier than any one of plural second process modules belonging to the second group, the controller estimates residual times left until respective second process modules currently executing the conditioning complete the conditioning; and
   if the shortest one of the residual times associated with the second process modules currently executing the conditioning becomes shorter than a reference value, the controller deems that the second module having the shortest residual time has completed the conditioning, and makes up a set of process modules including one first process module having completed the conditioning and one second process module which is deemed to have completed the conditioning, and the controller controls the transfer system such that transfer of a substrate on a transfer route associated with the first process module having completed the conditioning is started.

5. The processing system according to claim 4, wherein the controller is configured to determine the reference value by summing a first transfer time required for an unprocessed substrate, which is to be loaded into a first process module which has completed the conditioning, to be loaded into the a first process module from a current position of the unprocessed substrate, a recipe time for which the substrate will stay in the first process module in order to undergo the first process, and a second transfer time for unloading the substrate, which has completed the staying in the first transfer module, from the first transfer module.

6. The processing system according to claim 3, wherein the controller is configured to establish a first set of process modules comprising a process module that has firstly that completed the conditioning among the process modules of the first group, and a process module that has firstly completed the conditioning among the process modules of the second group, and configured to establish a second set of process modules comprising a process module that has secondly completed the conditioning next earliest among the process modules of the first group, and a process module that has secondly completed the conditioning among the process modules of the second group.

7. The processing system according to any one of claims 1 to 6, wherein, each of the process modules includes a susceptor to hold and heat a substrate, and the controller is configured to judge that the conditioning has been completed, when the controller receives from the process module a signal which indicates that temperature of the susceptor has reached a designated value.

8. The processing system according to any one of claims 1 to 6, wherein:

each of the process modules includes a vacuum chamber to execute the process under a reduced pressure; and the first transfer module is a vacuum transfer module having a vacuum transfer chamber to transfer a substrate under a reduced pressure, and the first transfer mechanism is disposed in the vacuum transfer chamber, said processing system further comprising:

a load port for supporting the cassette under an atmospheric pressure;

an atmospheric transfer module coupled to the load port, the atmospheric transfer module internally having a second transfer mechanism; and at least one loadlock module disposed between the atmospheric transfer module and the vacuum transfer module, the loadlock module being configured so that an interior thereof is selectively switched to an atmospheric-pressure state or a reduced-pressure state in order to temporarily place therein a substrate which is transferred between the atmospheric transfer module and the vacuum transfer module, wherein the transfer route between the cassette and the process modules passes through the atmospheric transfer module, the loadlock module, and the vacuum transfer module.

9. A method of operating a processing system, the processing system including a plurality of process modules of plural types, each type configured to perform substantially the same process to a substrate, and a transfer system configured to transfer each of plural substrates from a cassette containing the plural substrates to any one of the process modules, said method comprising:

(a) monitoring a conditioning status of each process module after each process module begins conditioning;

(b) immediately after at least one process module of each type has completed conditioning to become a conditioning-completed module, making up a first set of conditioning-completed process modules by selecting one conditioning-completed module of each type, and starting transferring one of the substrates by the transfer system along a first transfer path for transferring the one substrate to the first set of process modules, and starting performing of the composite processes by use of the process modules of the first set;

(c) thereafter, immediately after at least one process module of each type, among the processing modules which do not yet belong to a set of process modules, has completed the conditioning to become a conditioning-completed module, making up another set of conditioning-completed process modules by selecting one conditioning-completed module of each type and starting transferring by the transfer system of another of the substrates along another transfer path for transferring the another substrate to said another set of process modules, and starting performing the composite processes by use of process modules of said another set;

(d) repeating (c) until there is no conditioning-completed module that does not belong to a set; and (e) thereafter, performing the composite process to the plurality of substrates, while distributing the substrates to any one of the process module sets whereby each substrate is transferred to and processed only by the process modules of the set to which the substrate is distributed.

10. A method of operating a processing system, the processing system including a plurality of process modules, including plural types of process modules, wherein the same number of process modules belong to each type such that plural sets of process modules, each set including process modules of respective types to perform a composite process composed of a series of processes, can be made up, and a transfer system configured to transfer plural substrates from a cassette containing the plural substrates to the process modules, said method comprising:

(a) monitoring a conditioning status of each process module after each process module begins conditioning;

(b) immediately after at least one process module of each type has completed conditioning to become a conditioning completed module, making up a first set of conditioning-completed process modules by selecting one conditioning-completed module of each type and starting transferring one of the substrates by the transfer system along a first transfer path for transferring the one substrate to the first set of process modules, and starting performing of the composite processes by use of the process modules of the first set;

(c) thereafter, immediately after at least one process module of each type, among the processing modules which do not yet belong to a set of process modules, has completed the conditioning to become a conditioning-completed module, making up another set of conditioning-completed process modules by selecting one conditioning-completed module of each type and starting transferring by the transfer system of another of the substrates along another transfer path for transferring the another substrate to said another set of process modules, and starting performing the composite processes by use of process modules of said another set (d) repeating (c) until there is no conditioning-completed module that does not belong to a set; and (e) thereafter, performing the composite process to the plurality of substrates, while distributing the substrates to any one of the process module sets whereby each substrate is transferred to and processed only by the process modules of the set to which the substrate is distributed.

\* \* \* \* \*